(12) United States Patent
Blanchard et al.

(10) Patent No.: US 7,304,347 B2
(45) Date of Patent: *Dec. 4, 2007

(54) METHOD FOR FABRICATING A POWER SEMICONDUCTOR DEVICE HAVING A VOLTAGE SUSTAINING LAYER WITH A TERRACED TRENCH FACILITATING FORMATION OF FLOATING ISLANDS

(75) Inventors: Richard A. Blanchard, Los Altos, CA (US); Jean-Michel Guillot, Clyone (IL)

(73) Assignee: Vishay General Semiconductor Inc., Melville, NY (US)

( * ) Notice: Subject to any disclaimer, the term of this patent is extended or adjusted under 35 U.S.C. 154(b) by 298 days.

This patent is subject to a terminal disclaimer.

(21) Appl. No.: 10/712,810

(22) Filed: Nov. 13, 2003

(65) Prior Publication Data
US 2004/0097028 A1 May 20, 2004

Related U.S. Application Data

(62) Division of application No. 09/970,758, filed on Oct. 4, 2001, now Pat. No. 6,649,477.

(51) Int. Cl.
*H01L 29/76* (2006.01)
(52) U.S. Cl. .............. 257/327; 257/328; 257/329; 257/E21.418; 257/E29.04
(58) Field of Classification Search ........ 257/330–333, 257/328–329, 339, 327, E21.418, E29.04
See application file for complete search history.

(56) References Cited

U.S. PATENT DOCUMENTS

| H204 H | 2/1987 | Oh et al. ............... 438/433 |
|---|---|---|
| 4,719,185 A | 1/1988 | Goth .................... 257/525 |
| 4,754,310 A | 6/1988 | Coe ..................... 257/287 |
| 4,893,160 A * | 1/1990 | Blanchard ............. 257/334 |
| 4,929,563 A | 5/1990 | Tsunoda et al. ........ 257/493 |
| 5,216,275 A * | 6/1993 | Chen .................... 257/493 |
| 5,488,236 A | 1/1996 | Baliga et al. .......... 257/132 |
| 5,831,288 A | 11/1998 | Singh et al. ........... 257/330 |

(Continued)

Primary Examiner—Thao X. Le
(74) Attorney, Agent, or Firm—Mayer & Williams PC; Stuart H. Mayer, Esq.; Kevin L. Williams, Esq.

(57) ABSTRACT

A method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one terraced trench in the epitaxial layer. The terraced trench has a plurality of portions that differ in width to define at least one annular ledge therebetween. A barrier material is deposited along the walls of the trench. A dopant of a second conductivity type is implanted through the barrier material lining the annular ledge and said trench bottom and into adjacent portions of the epitaxial layer. The dopant is diffused to form at least one annular doped region in the epitaxial layer and at least one other region located below the annular doped region. A filler material is deposited in the terraced trench to substantially fill the trench, thus completing the voltage sustaining region. At least one region of the second conductivity type is formed over the voltage sustaining region to define a junction therebetween.

18 Claims, 8 Drawing Sheets

U.S. PATENT DOCUMENTS

| | | | |
|---|---|---|---|
| 6,078,078 A * | 6/2000 | Gardner et al. | 257/330 |
| 6,097,076 A | 8/2000 | Gonzalez et al. | 257/510 |
| 6,174,773 B1 * | 1/2001 | Fujishima | 438/270 |
| 6,191,447 B1 * | 2/2001 | Baliga | 257/330 |
| 6,194,741 B1 | 2/2001 | Kinzer et al. | 257/329 |
| 6,362,505 B1 | 3/2002 | Tihanyi | 257/329 |
| 6,380,569 B1 | 4/2002 | Chang et al. | 257/256 |
| 6,395,604 B1 * | 5/2002 | Kubo et al. | 438/270 |
| 6,468,847 B1 | 10/2002 | Disney | 438/197 |
| 7,084,455 B2 * | 8/2006 | Blanchard | 257/328 |
| 2001/0036704 A1 | 11/2001 | Hueting et al. | 438/270 |
| 2001/0046753 A1 | 11/2001 | Gonzalex et al. | 438/424 |
| 2001/0053568 A1 | 12/2001 | Deboy et al. | 438/138 |

* cited by examiner

CONVENTIONAL MOSFET

THE SPECIFIC ON-RESISTANCE OF A VERTICAL DMOS TRANSISTOR WITH THE DOPANT DISTRIBUTION OF FIG. 1

STEP

1. EPITAXIAL DEPOSITION
2. FORM BARRIER LAYER
3. MASK AND ETCH THE TRENCH BARRIER LAYER
4. TRENCH ETCH

STEP

5. FORM A LAYER OF MATERIAL ON THE INSIDE OF TRENCH
6. ETCH LAYER FROM TRENCH BOTTOM

STEP

7. ETCH TRENCH

8. FORM A LAYER OF MATERIAL ON THE INSIDE OF THE TRENCH

STEP

9. REPEAT THE STEPS OF ETCHING THE MATERIAL FROM THE BOTTOM OF THE TRENCH, ETCHING THE SILICON TO INCREASE THE DEPTH OF THE TRENCH, AND FORMING ADDITIONAL MATERIAL ON THE SIDEWALLS AND THE BOTTOM OF THE TRENCH FOR ALL BUT THE LAST LAYER OF ISLANDS

STEP

10. ETCH LAYER FROM TRENCH BOTTOM AND ETCH TRENCH

11. REMOVE ALL MATERIAL FROM TRENCH SIDEWALL

12. GROW OXIDE LAYER

STEP

13. ION IMPLANTATION

14. DIFFUSION

15. FILL TRENCH

16. PLANARIZE THE WAFER

STEP

13. ION IMPLANTATION
14. DIFFUSION
15. FILL TRENCH
16. PLANARIZE THE WAFER

__(12)__ United States Patent

METHOD FOR FABRICATING A POWER SEMICONDUCTOR DEVICE HAVING A VOLTAGE SUSTAINING LAYER WITH A TERRACED TRENCH FACILITATING FORMATION OF FLOATING ISLANDS

RELATED APPLICATIONS

This application is a division of U.S. patent application Ser. No. 09/970,758 entitled "Method For Fabricating A Power Semiconductor Device Having A Voltage Sustaining Layer With A Terraced Trench Facilitating Formation Of Floating Islands" filed on Oct. 4, 2001 now U.S. Pat. No. 6,649,477.

FIELD OF THE INVENTION

The present invention relates generally to semiconductor power devices, and more particularly to a semiconductor power device such as a MOSFET and other power devices that use floating islands of oppositely doped material to form the voltage sustaining layer.

BACKGROUND OF THE INVENTION

Semiconductor power devices such as vertical DMOS, V-groove DMOS, and trench DMOS MOSFETs, IGBTs as well as diodes and bipolar transistors are employed in applications such as automobile electrical systems, power supplies, motor drives, and other power control applications. Such devices are required to sustain high voltage in the off-state while having low on-resistance or a low voltage drop with high current density in the on-state.

FIG. 1 illustrates a typical structure for an N-channel power MOSFET. An N-epitaxial silicon layer 101 formed over an N+ doped silicon substrate 102 contains p-body regions 105a and 106a, and N+ source regions 107 and 108 for two MOSFET cells in the device. P-body regions 105 and 106 may also include deep p-body regions 105b and 106b. A source-body electrode 112 extends across certain surface portions of epitaxial layer 101 to contact the source and body regions. The N-type drain for both cells is formed by the portion of N-type epitaxial layer 101 extending to the upper semiconductor surface in FIG. 1. A drain electrode is provided at the bottom of N+ doped substrate 102. An insulated gate electrode 118 comprising insulating and conducting layers, e.g., oxide and polysilicon layers, lies over the body where the channel will be formed and over drain portions of the epitaxial layer.

The on-resistance of the conventional MOSFET shown in FIG. 1 is determined largely by the drift zone resistance in epitaxial layer 101. Epitaxial layer 101 is also sometimes referred to as a voltage sustaining layer since the reverse voltage applied between the N+ doped substrate and the P+ doped deep body regions is sustained by epitaxial layer 101. The drift zone resistance is in turn determined by the doping concentration and the thickness of epitaxial layer 101. However, to increase the breakdown voltage of the device, the doping concentration of epitaxial layer 101 must be reduced while the layer thickness is increased. The curve in FIG. 2 shows the on-resistance per unit area as a function of the breakdown voltage for a conventional MOSFET. Unfortunately, as the curve shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in Cezac et al., *Proceedings of the ISPSD*, May 2000, pp. 69-72, and Chen et al., *IEEE Transactions on Electron Devices*, Vol. 47, No. 6, June 2000, pp. 1280-1285, which are hereby incorporated by reference in their entirety. This MOSFET is similar to the conventional MOSFET shown in FIG. 1 except that it includes a series of vertically separated P− doped layers $310_1$, $310_2$, $310_3$, . . . $310_n$ (so-called "floating islands"), which are located in the drift region of the voltage sustaining layer 301. The floating islands $310_1$, $310_2$, $310_3$, . . . $310_n$ produce an electric field that is lower than for a structure with no floating islands. The lower electric field allows a higher dopant concentration to be used in the epitaxial layer that in part, forms the voltage sustaining layer 301. The floating islands produce a saw-shaped electric field profile, the integral of which leads to a sustained voltage obtained with a higher dopant concentration than the concentration used in conventional devices. This higher dopant concentration, in turn, produces a device having an on-resistance that is lower than that of a device without one or more layers of floating islands.

The structure shown in FIG. 3 can be fabricated with a process sequence that includes multiple epitaxial deposition steps, each followed by the introduction of the appropriate dopant. Unfortunately, epitaxial deposition steps are expensive to perform and thus a structure that uses multiple epitaxial deposition steps is expensive to manufacture.

Accordingly, it would be desirable to provide a method of fabricating a power semiconductor device such as the MOSFET structure shown in FIG. 3, which method requires a minimum number of epitaxial deposition steps so that the device can be produced less expensively.

SUMMARY OF THE INVENTION

In accordance with the present invention, a method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one terraced trench in the epitaxial layer. The terraced trench has a plurality of portions that differ in width to define at least one annular ledge therebetween. A barrier material is deposited along the walls of the trench. A dopant of a second conductivity type is implanted through the barrier material lining the annular ledge and said trench bottom and into adjacent portions of the epitaxial layer. The dopant is diffused to form at least one annular doped region in the epitaxial layer. One other region located below the annular doped region may also be formed. A filler material is deposited in the terraced trench to substantially fill the trench, thus completing the voltage sustaining region. At least one region of the second conductivity type is formed over the voltage sustaining region to define a junction therebetween.

The power semiconductor device formed by the inventive method may be selected from the group consisting of a vertical DMOS, V-groove DMOS, and a trench DMOS MOSFET, an IGBT, a bipolar transistor, and diodes.

DETAILED DESCRIPTION

Figure 4:
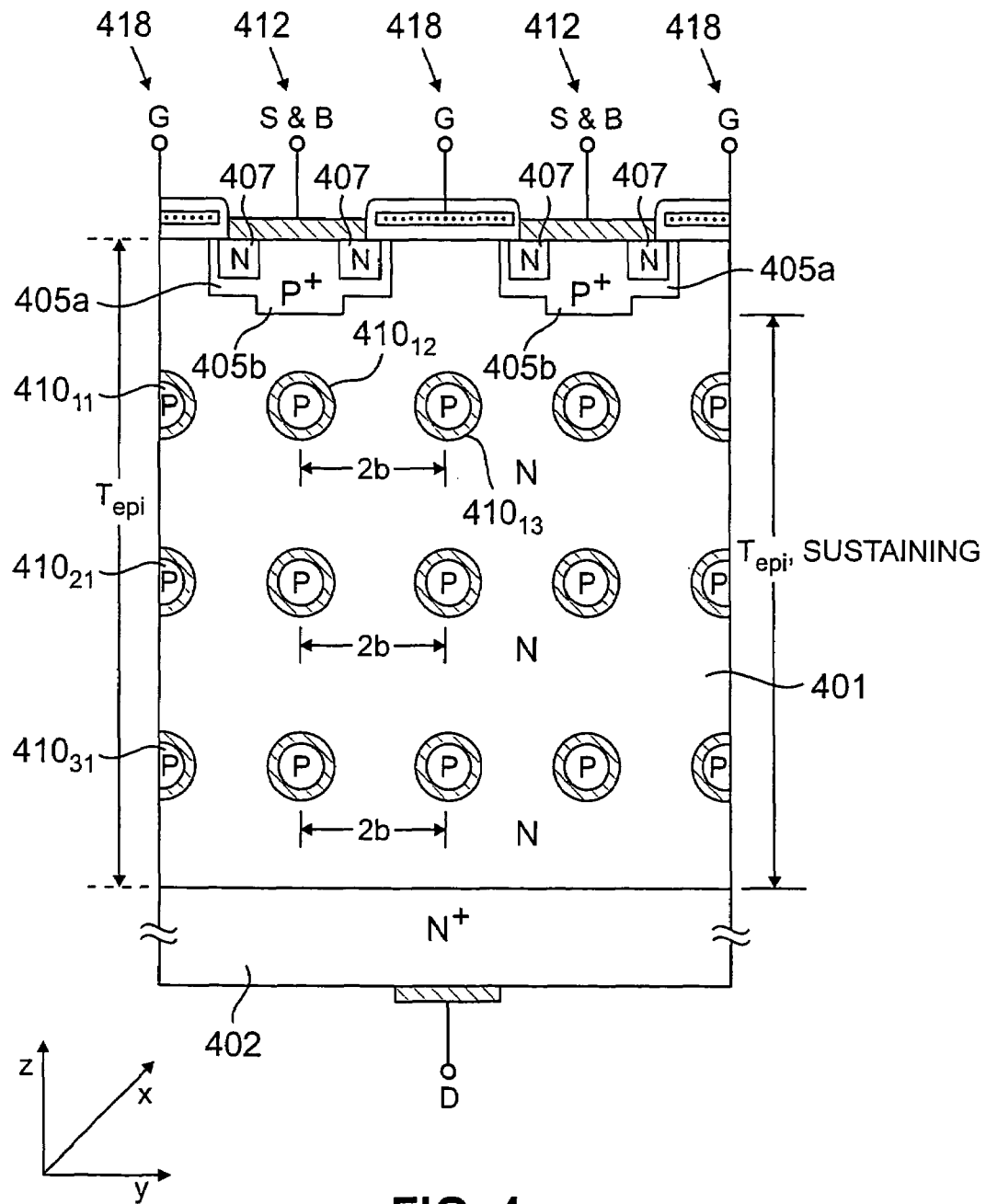
FIG. 4 shows a MOSFET structure that includes a voltage sustaining region with floating islands both below and between the body regions.

FIG. 4 shows a power semiconductor device having floating islands of the type disclosed in co-pending U.S. Application Ser. No. 09/970,972. In this device the trenches are assumed to be circular and therefore the floating islands are depicted as donut-shaped. Of course, the trenches may have other shapes such squares, rectangles, hexagons, or the like, which in turn will determine the shape of the floating islands. An N-type epitaxial silicon layer 401 formed over an N+ silicon substrate 402 contains P-body regions 405, and N+ source regions 407 for two MOSFET cells in the device. As shown, P-body regions 405a may also include deep P-body regions 405b. A source-body electrode 412 extends across certain surface portions of epitaxial layer 401 to contact the source and body regions. The N-type drain for both cells is formed by the portion of N-epitaxial layer 401 extending to the upper semiconductor surface. A drain electrode is provided at the bottom of N+ substrate 402. An insulated gate electrode 418 comprising oxide and polysilicon layers lies over the channel and drain portions of the body. A series of floating islands 410 are located in the voltage sustaining region of the device defined by epitaxial silicon layer 401. The floating islands are arranged in an array when viewed from the top of the device. For instance, in FIG. 4, in the "y" direction, floating islands are denoted by reference numerals $410_{11}, 410_{12}, 410_{13}, \ldots 410_{1m}$ and in the "z" direction floating islands are denoted by reference numerals $410_{11}, 410_{21}, 410_{31}, \ldots 410_{m1}$. While the column of floating islands 410 located below the gate 418 may or may not be employed, they are preferably employed when required for the device geometry and the resistivity of epitaxial layer 401.

Figure 1:
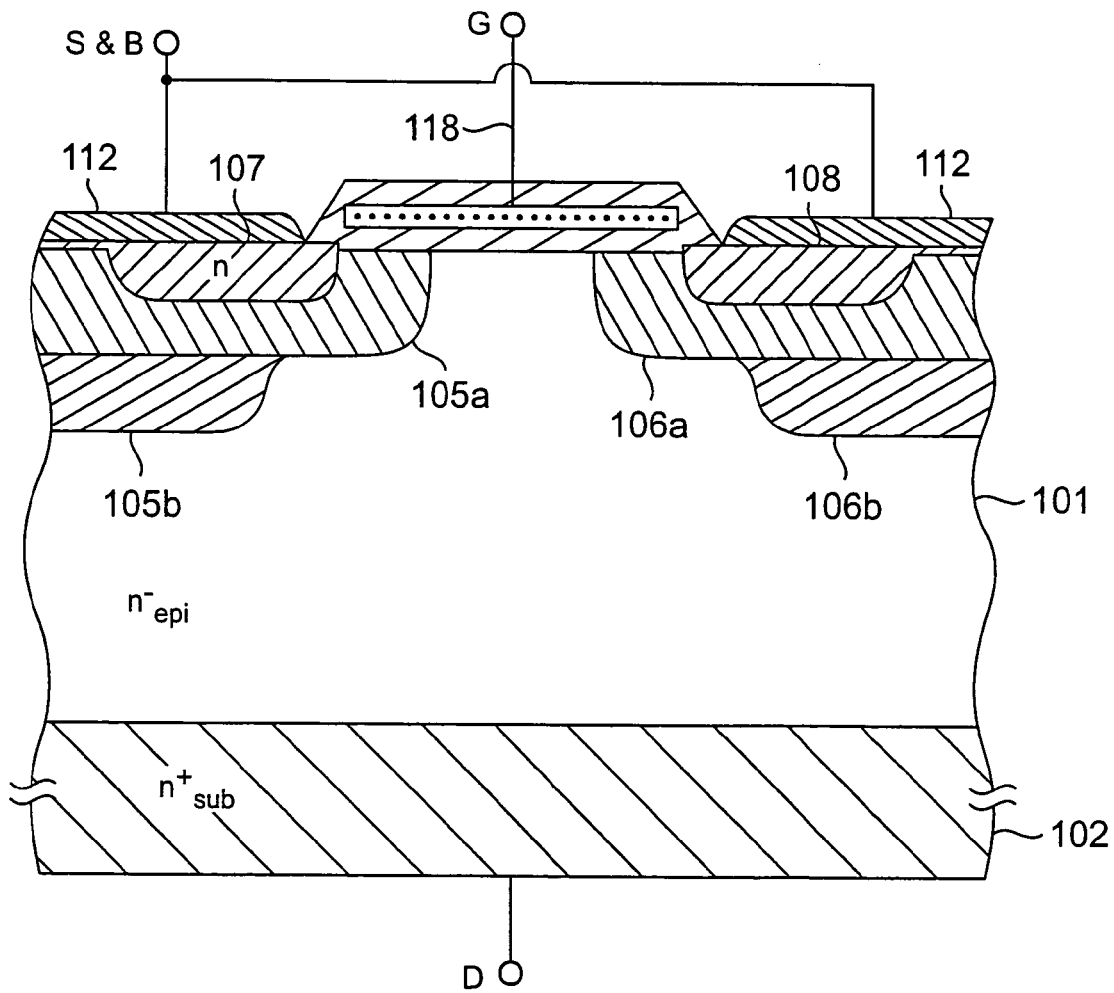
FIG. 1 shows a cross-sectional view of a conventional power MOSFET structure.
Figure 2:
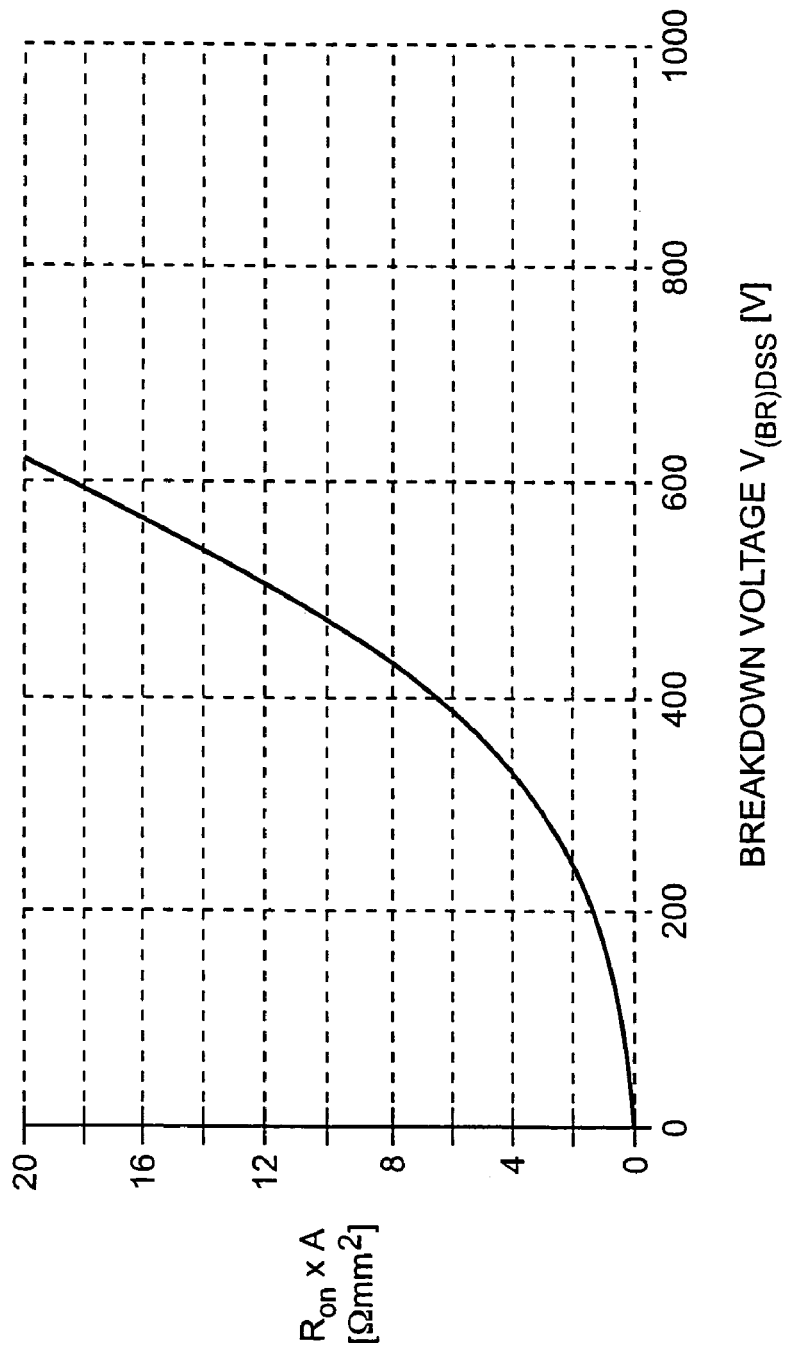
FIG. 2 shows the on-resistance per unit area as a function of the breakdown voltage for a conventional power MOSFET.
Figure 3:
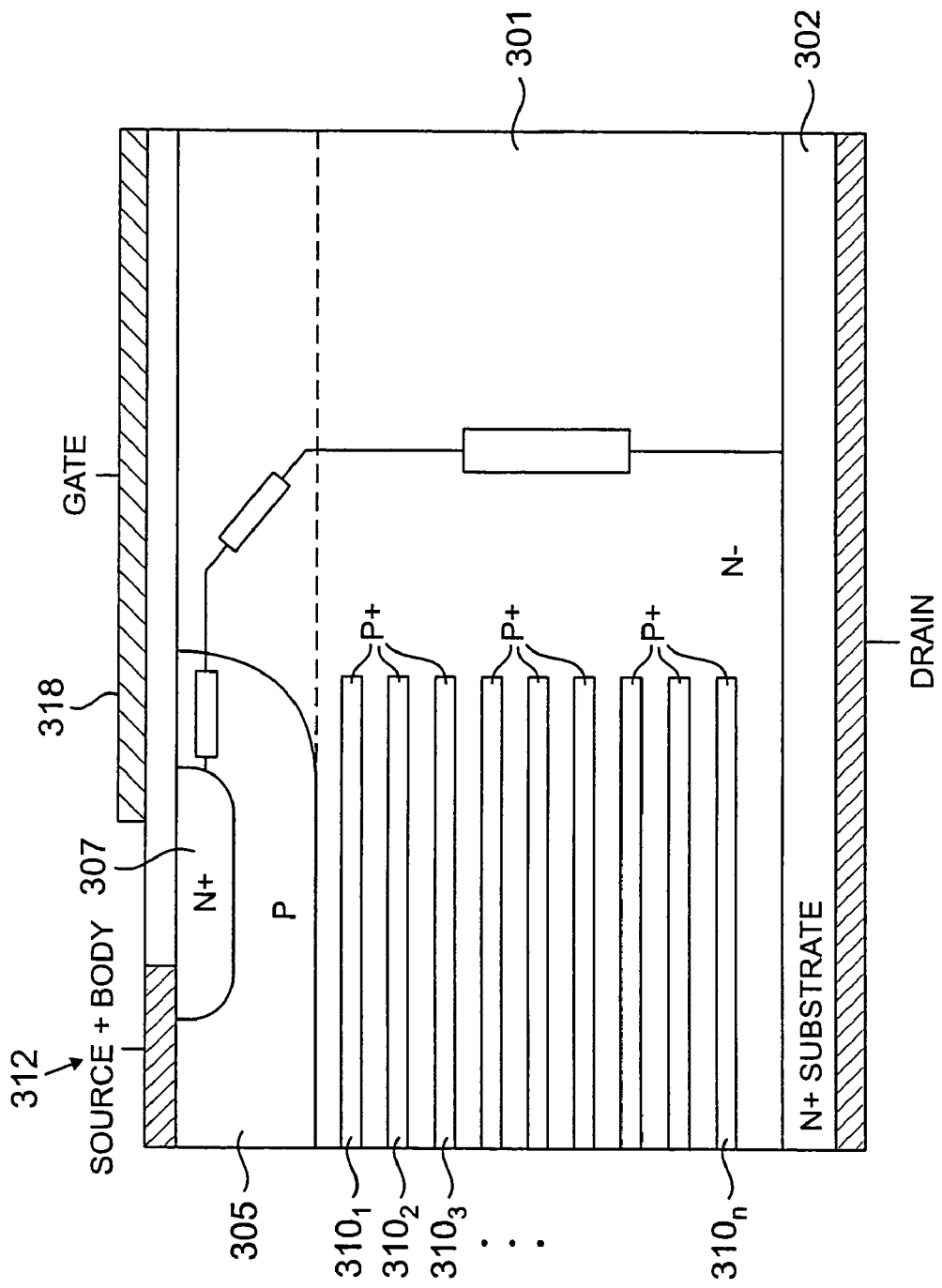
FIG. 3 shows a MOSFET structure that includes a voltage sustaining region with floating islands located below the body region, which is designed to operate with a lower on-resistance per unit area at the same voltage than the structure depicted in FIG. 1.

In the device of FIG. 4, each horizontal row of floating islands, such as row $410_{11}, 410_{12}, 410_{13}, \ldots 410_{1m}$, is formed in a separate implantation step. While this fabrication technique advantageously reduces the required number of epitaxial deposition steps in comparison to the known fabrication technique discussed in connection with FIG. 3, it would nevertheless be desirable to further simply the fabrication process by reducing the number of implantation steps that are required.

In accordance with the present invention, the p-type floating islands are configured as a series of coaxially located annular ledges. A method of forming such floating islands in the voltage sustaining layer of a semiconductor power device may be generally described as follows. First, a terraced trench is formed in the epitaxial layer that is to form the voltage sustaining region of the device. The terraced trench is formed from two or more co-axially located trenches that are etched at different depths in the epitaxial layer The diameter of each individual trench is greater than the diameter of the trenches located at greater depths in the epitaxial layer. Adjacent trenches meet in horizontal planes to define annular ledges, which arise from the differential in the diameter of the adjacent trenches. P-type dopant material is implanted into both the annular ledges and the bottom of the deepest trench in a single implantation step. If desired, the bottom trench may be continued to form a bottom annular ring of dopant. The implanted material is diffused into the portion of the voltage sustaining region located immediately adjacent to and below the ledges and trench bottom. The implanted material thus forms a series of floating islands that are configured as coaxially-located annular rings. Finally, the trenches are filled with a material that does not adversely affect the characteristics of the device. Exemplary materials that may be used for the material filling the trenches include highly resistive polysilicon, a dielectric such as silicon dioxide, or other materials and combinations of materials.

The power semiconductor device of the present invention may be fabricated in accordance with the following exemplary steps, which are illustrated in FIGS. 5(a)-5(f).

First, the N-type doped epitaxial layer 501 is grown on a conventionally N+ doped substrate 502. Epitaxial layer 501 is typically 15-50 microns in thickness for a 400-800 V device with a resistivity of 5-40 ohm-cm. Next, a dielectric masking layer is formed by covering the surface of epitaxial layer 501 with a dielectric layer, which is then conventionally exposed and patterned to leave a mask portion that defines the location of the trench $520_1$. The trench $520_1$ is dry etched through the mask openings by reactive ion etching to an initial depth that may range from 5-15 microns. In particular, if "x" is the number of equally spaced horizontal rows of floating islands that are desired, the trench 520 should be initially etched to a depth of approximately $1/(x+1)$ of the thickness of the portion of epitaxial layer 502 that is between the subsequently-formed bottom of the body region and the top of the N+ doped substrate. The sidewalls of each trench may be smoothed, if needed. First, a dry chemical etch may be used to remove a thin layer of oxide (typically about 500-1000 A) from the trench sidewalls to eliminate damage caused by the reactive ion etching process. Next, a sacrificial silicon dioxide layer is grown over the trench $520_1$. The sacrificial layer is removed either by a buffer oxide etch or an HF etch so that the resulting trench sidewalls are as smooth as possible.

Figure 5A:
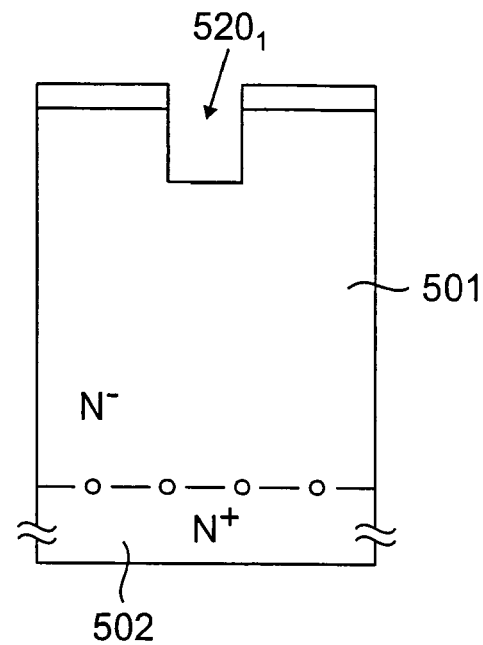
FIGS. 5(a)-5(g) show a sequence of exemplary process steps that may be employed to fabricate a voltage sustaining region constructed in accordance with the present invention.
Figure 5B:
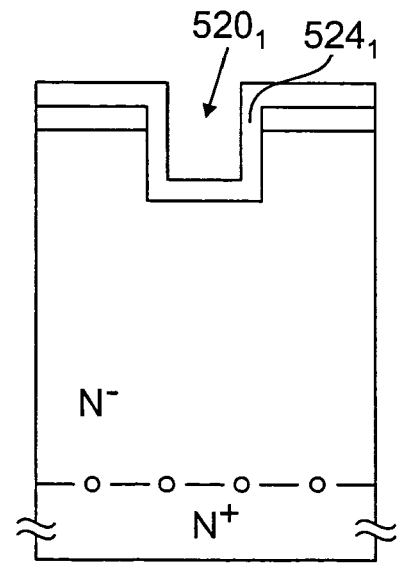

In FIG. 5(b), a layer of silicon dioxide $524_1$ is grown in trench $520_1$. The thickness of the silicon dioxide layer $524_1$ will determine the differential in diameter (and hence the radial width of the resulting annular ledge) between trench $520_1$ and the trench that is to be subsequently formed. Oxide layer $524_1$ is removed from the bottom of the trench $520_1$.

Figure 5C:
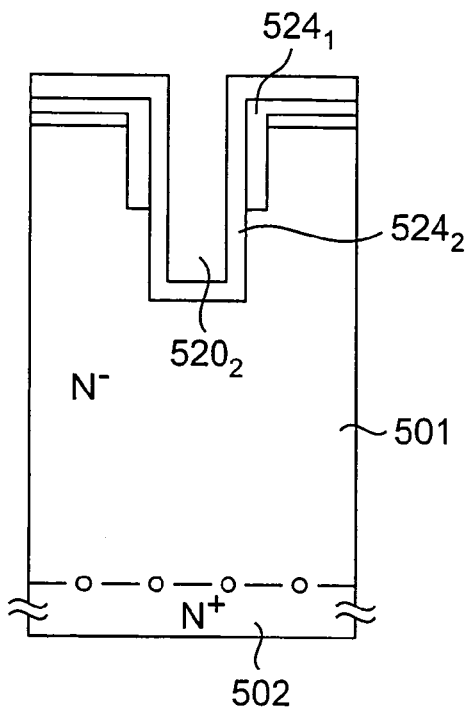

In FIG. 5(c), a second trench $520_2$ is etched through the exposed bottom of the trench $520_1$. In this embodiment of the invention the thickness of trench $520_2$ is the same as the thickness of trench $520_1$. That is, trench $520_2$ is etched by an amount approximately equal to $1/(x+1)$ of the thickness of the portion of epitaxial layer 501 that is located between the bottom of the body region and the N+-doped substrate. Accordingly, the bottom of trench $520_2$ is located at a depth of $2/(x+1)$ below the bottom of the body region.

Figure 5D:
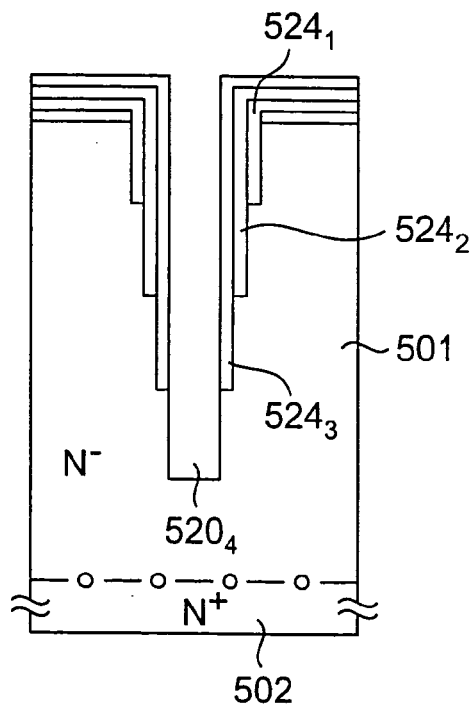
Figure 5E:
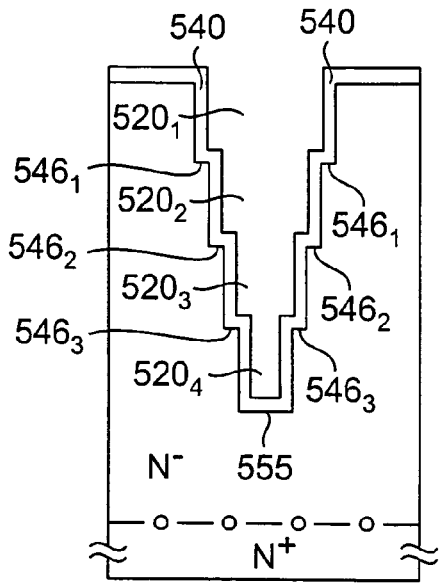
Figure 5F:
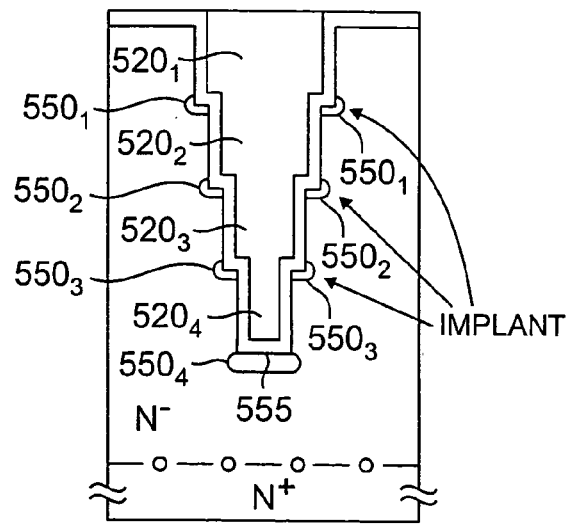

Next, in FIG. 5(d), a third trench $520_3$ (most clearly seen in FIGS. 5(e) and 5(f)) may be formed by first growing an oxide layer $524_2$ on the walls of trench $520_2$. Once again, the thickness of the silicon dioxide layer $524_2$ will determine the differential in diameter (and hence the radial width of the resulting annular ledge) between trench $520_2$ and trench $520_3$. Oxide layer $524_2$ is removed from the bottom of the trench $520_2$. This process can be repeated as many times as necessary to form the desired number of trenches, which in turn dictates the number of annular ledges that are to be formed. For example, in FIG. 5(d), four trenches $520_1$-$520_4$ (more clearly seen in FIG. 5(e)) are formed.

In FIG. 5(e), the various layers of oxide material located on the sidewalls of the trenches $520_1$-$520_4$ are removed by etching to define annular ledges $546_1$-$546_3$. Next, an oxide layer 540 of substantially uniform thickness is grown in the trenches $520_1$-$520_4$. The thickness of oxide layer 540 should be sufficient to prevent implanted atoms from penetrating through the sidewalls of the trenches into the adjacent silicon, while allowing the implanted atoms to penetrate through the portion of oxide layer 540 located on the ledges $546_1$-$546_3$ and the trench bottom 555.

The diameter of trenches $520_1$-$520_4$ should be selected so that the resulting annular ledges $546_1$-$546_3$ and the trench bottom all have the same surface area. In this way, when a dopant is introduced into the ledges and trench bottom, each resulting horizontal plane of floating islands will have the same total charge.

Next, in FIG. 5(f), a dopant such as boron is implanted through the portion of oxide layer 540 located on the ledges $546_1$-$546_3$ and the trench bottom 555. The total dose of dopant and the implant energy should be chosen such that the amount of dopant left in the epitaxial layer 501 after the subsequent diffusion step is performed satisfies the breakdown requirements of the resulting device. A high temperature diffusion step is performed to "drive-in" the implanted dopant both vertically and laterally, thus defining the coaxially located floating islands $550_1$-$550_4$.

Figure 5G:
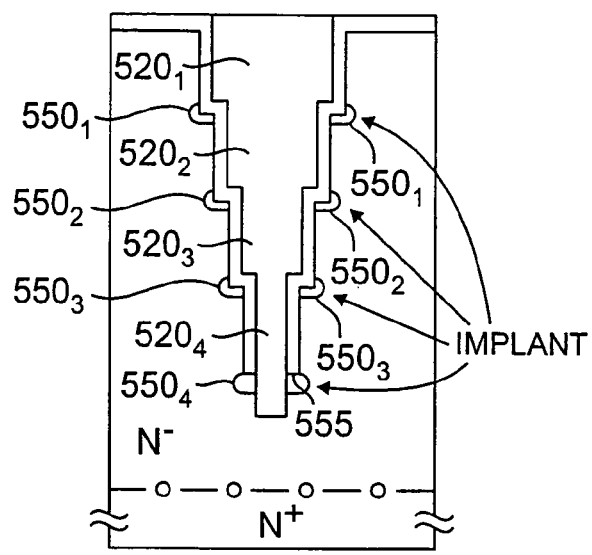

The terraced trench, which is composed of individual trenches $520_1$-$520_4$, is next filled with a material that does not adversely affect the characteristics of the device. Exemplary materials include, but are not limited to, thermally grown silicon dioxide, a deposited dielectric such as silicon dioxide, silicon nitride, or a combination of thermally grown and deposited layers of these or other materials. Finally, the surface of the structure is planarized as shown in FIG. 5(f). FIG. 5(g) shows the structure of FIG. 5(f), but with the bottom trench etched further to form a bottom annular ring of dopant.

The aforementioned sequence of processing steps resulting in the structure depicted in FIG. 5(f) and 5(g) provide a voltage sustaining layer with a series of annular floating islands on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 4 shows an example of a MOSFET that may be formed on the voltage sustaining region of FIG. 5. It should be noted that while FIG. 5 shows a single terraced trench, the present invention encompasses a voltage sustaining regions having single or multiple terraced trenches to form any number of columns of annular floating islands.

Once the voltage sustaining region and the floating islands have been formed as shown in FIG. 5, the MOSFET shown in FIG. 4 can be completed in the following manner. The gate oxide is grown after an active region mask is formed. Next, a layer of polycrystalline silicon is deposited, doped, and oxidized. The polysilcon layer is then masked to form the gate regions. The p+ doped deep body regions 405b are formed using conventional masking, implantation and diffusion steps. For example, the p+-doped deep body regions are boron implanted at 20 to 200 KeV with a dosage from about $1\times10^{14}$ to $5\times10^{15}/cm^2$. The shallow body region 405a is formed in a similar fashion. The implant dose for this region will be $1\times10^{13}$ to $5\times10^{14}/cm^2$ at an energy of 20 to 100 KeV.

Next, a photoresist masking process is used to form a patterned masking layer that defines source regions 407. Source regions 407 are then formed by an implantation and diffusion process. For example, the source regions may be implanted with arsenic at 20 to 100 KeV to a concentration that is typically in the range of $2\times10^{15}$ to $1.2\times10^{16}/cm^2$. After implantation, the arsenic is diffused to a depth of approximately 0.5 to 2.0 microns. The depth of the body region typically ranges from about 1-3 microns, with the P+ doped deep body region (if present) being slightly deeper. Finally, the masking layer is removed in a conventional manner. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped deep body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A power semiconductor device made in accordance with a method comprising the steps of:
   A. providing a substrate of a first conductivity type;
   B. forming a voltage sustaining region on said substrate;
      1. depositing an epitaxial layer on the substrate, said epitaxial layer having a first conductivity type;
      2. forming at least one terraced trench in said epitaxial layer, said terraced trench having a plurality of portions that differ in width to define at least one annular ledge therebetween;
      3. depositing a barrier material along the walls and bottom of said trench;
      4. implanting a dopant of a second conductivity type through the barrier material lining said at least one annular ledge and said trench bottom and into adjacent portions of the epitaxial layer;

5. diffusing said dopant to form at least one annular doped region in said epitaxial layer and at least one other region located below said annular doped region in said epitaxial layer;
6. depositing a filler material in said terraced trench to substantially fill said terraced trench; and C. forming over said voltage sustaining region at least one region of said second conductivity type to define a junction therebetween.

2. A power semiconductor device made in accordance with a method comprising the steps of:
A. providing a substrate of a first conductivity type;
B. forming a voltage sustaining region on said substrate by:
1. depositing an epitaxial layer on the substrate, said epitaxial layer having a first conductivity type;
3. forming at least one terraced trench in said epitaxial layer, said terraced trench having a plurality of portions that differ in width to define at least one annular ledge therebetween;
3. depositing a barrier material along the walls and bottom of said trench;
4. implanting a dopant of a second conductivity type through the barrier material lining said at least one annular ledge and said trench bottom and into adjacent portions of the epitaxial layer;
5. diffusing said dopant to form at least one annular doped region in said epitaxial layer and at least one other region located below said annular doped region in said epitaxial layer;
7. depositing a filler material in said terraced trench to substantially fill said terraced trench; and C. forming over said voltage sustaining region at least one region of said second conductivity type to define a junction therebetween,
wherein said plurality of portions of the terraced trench are coaxially located with respect to one another, and
wherein said plurality of portions of the terraced trench includes at least three portions that differ in width from one another to define at least two annular ledges and said at least one annular doped region includes at least two annular doped regions, and
wherein the step of forming at least one terraced trench includes the steps of successively etching said at least three portions of the terraced trench beginning with a largest width portion and ending with a smallest width portion.

3. A power semiconductor device made in accordance with a method comprising the steps of:
A. providing a substrate of a first conductivity type;
B. forming a voltage sustaining region on said substrate by:
1. depositing an epitaxial layer on the substrate, said epitaxial layer having a first conductivity type;
4. forming at least one terraced trench in said epitaxial layer, said terraced trench having a plurality of portions that differ in width to define at least one annular ledge therebetween;
3. depositing a barrier material along the walls and bottom of said trench;
4. implanting a dopant of a second conductivity type through the barrier material lining said at least one annular ledge and said trench bottom and into adjacent portions of the epitaxial layer;

5. diffusing said dopant to form at least one annular doped region in said epitaxial layer and at least one other region located below said annular doped region in said epitaxial layer;
8. depositing a filler material in said terraced trench to substantially fill said terraced trench; and C. forming over said voltage sustaining region at least one region of said second conductivity type to define a junction therebetween,
wherein step (C) further includes the steps of:
forming a gate conductor above a gate dielectric region;
forming first and second body regions in the epitaxial layer to define a drift region therebetween, said body regions having a second conductivity type;
forming first and second source regions of the first conductivity type in the first and second body regions, respectively.

4. A power semiconductor device comprising:
a substrate of a first conductivity type;
a voltage sustaining region disposed on said substrate, said voltage sustaining region including:
an epitaxial layer having a first conductivity type;
at least one terraced trench located in said epitaxial layer, said terraced trench having a plurality of regions that differ in width to define at least one annular ledge therebetween;
at least one annular doped region having a dopant of a second conductivity type, said annular doped legion being located in said epitaxial layer below and adjacent to said annular ledge;
a filler material substantially filling said terraced trench; and
at least one active region of said second conductivity disposed over said voltage sustaining region to define a junction therebetween.

5. The device of claim 4 wherein said plurality of portions of the terraced trench includes a smallest width portion and a largest width portion, said smallest width portion being located at a depth in said epitaxial layer such that it is closer to the substrate than a largest width portion.

6. The device of claim 5 wherein said plurality of portions of the terraced trench are coaxially located with respect to one another.

7. The device of claim 4 wherein said plurality of portions of the terraced trench includes at least three portions that differ in width from one another to define at least two annular ledges and said at least one annular doped region includes at least two annular doped regions.

8. The device of claim 6 wherein said plurality of portions of the terraced trench includes at least three portions that differ in width from one another to define at least two annular ledges and said at least one annular doped region includes at least two annular doped regions.

9. The device of claim 4 wherein said epitaxial layer has a given thickness and further comprising the step of etching a first portion of the terraced trench by an amount substantially equal to $1/(x+1)$ of said given thickness where x is equal to or greater than a prescribed number of annular doped regions to be formed in the voltage sustaining region.

10. The device of claim 4 wherein said material filling the trench is a dielectric material.

11. The device of claim 10 wherein said dielectric material is silicon dioxide.

12. The device of claim 11 wherein said dielectric material is silicon nitride.

13. The device of claim 4 wherein said dopant is boron.

14. The device of claim 8 wherein a surface area of the at least two annular ledges are substantially equal to one another.

15. The device of claim 4 wherein said at least one active region further includes:
- a gate dielectric and a gate conductor disposed above said gate dielectric;
- first and second body regions located in the epitaxial layer to define a drift region therebetween, said body regions having a second conductivity type; and
- first and second source regions of the first conductivity type located in the first and second body regions, respectively.

16. The device of claim 15 wherein said body regions include deep body regions.

17. The device of claim 4 wherein said terraced trench has a circular cross-section.

18. The device of claim 4 wherein said terraced trench has a cross-sectional shape selected from the group consisting of a square, rectangle, octagon, and a hexagon.

* * * * *

UNITED STATES PATENT AND TRADEMARK OFFICE
CERTIFICATE OF CORRECTION

PATENT NO. : 7,304,347 B2
APPLICATION NO. : 10/712810
DATED : December 4, 2007
INVENTOR(S) : Richard A. Blanchard It is certified that error appears in the above-identified patent and that said Letters Patent is hereby corrected as shown below:

Col. 1, Line 36, after "contains", change "p-body" to -- P-body --.

Col. 1, Line 39, after "deep", change "p-body" to -- P-body --.

Col. 2, Line 27, after "perform", insert -- , --.

Col. 3, Line 21, after "circular", insert -- , --.

Col. 3, Line 21, after "therefore", insert -- , --.

Col. 3, Line 55, after "further", change "simply" to -- simplify --.

Col. 4, Line 54, after "invention", insert -- , --.

Col. 5, Line 44, after "5(*g*)", change "provide" to -- provides --.

Col. 5, Line 54, after "sustaining", change "regions" to -- region --.

Col. 5, Line 63, before "doped", change "p+" to -- P+ --.

Col. 5, Line 65, before "doped", change "p+" to -- P+ --.

Col. 6, Line 25, before "doped", change "p+" to -- P+ --.

Col. 6, Line 27, before "doped", change "p+" to -- P+ --.

UNITED STATES PATENT AND TRADEMARK OFFICE
CERTIFICATE OF CORRECTION

PATENT NO. : 7,304,347 B2
APPLICATION NO. : 10/712810
DATED : December 4, 2007
INVENTOR(S) : Richard A. Blanchard It is certified that error appears in the above-identified patent and that said Letters Patent is hereby corrected as shown below:

Col. 7, Claim 2, Line 18, before "forming", change "3." to -- 2. --.

Col. 7, Claim 2, Line 32, before "depositing", change "7." to -- 6. --.

Col. 7, Claim 3, Line 58, before "forming", change "4." to -- 2. --.

Col. 8, Claim 3, Line 5, before "depositing", change "8." to -- 6. --.

Signed and Sealed this

First Day of July, 2008

JON W. DUDAS
*Director of the United States Patent and Trademark Office*